(12) United States Patent
Yu et al.

(10) Patent No.: US 9,362,413 B2
(45) Date of Patent: Jun. 7, 2016

(54) MOTFT WITH UN-PATTERNED ETCH-STOP

(71) Applicants: Gang Yu, Santa Barbara, CA (US); Chan-Long Shieh, Paradise Valley, AZ (US); Juergen Musolf, Santa Barbara, CA (US); Fatt Foong, Goleta, CA (US); Tian Xiao, Santa Barbara, CA (US)

(72) Inventors: Gang Yu, Santa Barbara, CA (US); Chan-Long Shieh, Paradise Valley, AZ (US); Juergen Musolf, Santa Barbara, CA (US); Fatt Foong, Goleta, CA (US); Tian Xiao, Santa Barbara, CA (US)

(73) Assignee: CBRITE INC., Goleta, CA (US)

(*) Notice: Subject to any disclaimer, the term of this patent is extended or adjusted under 35 U.S.C. 154(b) by 0 days.

(21) Appl. No.: 14/081,130

(22) Filed: Nov. 15, 2013

(65) Prior Publication Data

US 2015/0137113 A1    May 21, 2015

(51) Int. Cl.
| | | |
|---|---|---|
| H01L 29/786 | (2006.01) | |
| H01L 29/24 | (2006.01) | |
| H01L 21/02 | (2006.01) | |
| H01L 29/66 | (2006.01) | |

(52) U.S. Cl.
CPC ...... *H01L 29/7869* (2013.01); *H01L 21/02565* (2013.01); *H01L 21/02664* (2013.01); *H01L 29/24* (2013.01); *H01L 29/66969* (2013.01)

(58) Field of Classification Search
CPC ............ H01L 29/786; H01L 29/78669; H01L 29/78676; H01L 29/78678; H01L 29/78684; H01L 29/7869; H01L 21/0271
See application file for complete search history.

(56) References Cited

U.S. PATENT DOCUMENTS

| | | | | |
|---|---|---|---|---|
| 8,158,466 B2* | 4/2012 | Kim | ................... | H01L 27/1214 257/E27.111 |
| 2008/0169471 A1* | 7/2008 | Shin et al. | ....................... | 257/59 |
| 2010/0252832 A1* | 10/2010 | Asano | ................. | H01L 27/1214 257/57 |
| 2011/0084272 A1* | 4/2011 | Miyanaga | ............... | H01L 29/45 257/43 |
| 2012/0235138 A1* | 9/2012 | Shieh | .................. | H01L 27/1288 257/43 |
| 2013/0095606 A1* | 4/2013 | Bayraktaroglu | .... | H01L 29/7869 438/104 |
| 2013/0260497 A1* | 10/2013 | Ahn | .................. | H01L 29/66969 438/34 |
| 2014/0273340 A1* | 9/2014 | Van Duren | ........ | H01L 21/30604 438/104 |

OTHER PUBLICATIONS

Balagurov et al., Russian Microelectronics, vol. 41, pp. 503-507. Published by Pleiades, Ltd in 2012.*
Matsumoto et al., Science 291, pp. 854-856. Published by Science in 2001.*

* cited by examiner

*Primary Examiner* — Jesse Y Miyoshi
*Assistant Examiner* — Tuan A Hoang
(74) *Attorney, Agent, or Firm* — Robert A. Parsons; Michael W. Goltry; Parsons & Goltry

(57) ABSTRACT

A method of fabricating a high mobility semiconductor metal oxide thin film transistor including the steps of depositing a layer of semiconductor metal oxide material, depositing a blanket layer of etch-stop material on the layer of MO material, and patterning a layer of source/drain metal on the blanket layer of etch-stop material including etching the layer of source/drain metal into source/drain terminals positioned to define a channel area in the semiconductor metal oxide layer. The etch-stop material being electrically conductive in a direction perpendicular to the plane of the blanket layer at least under the source/drain terminals to provide electrical contact between each of the source/drain terminals and the layer of semiconductor metal oxide material. The etch-stop material is also chemical robust to protect the layer of semiconductor metal oxide channel material during the etching process.

25 Claims, 13 Drawing Sheets

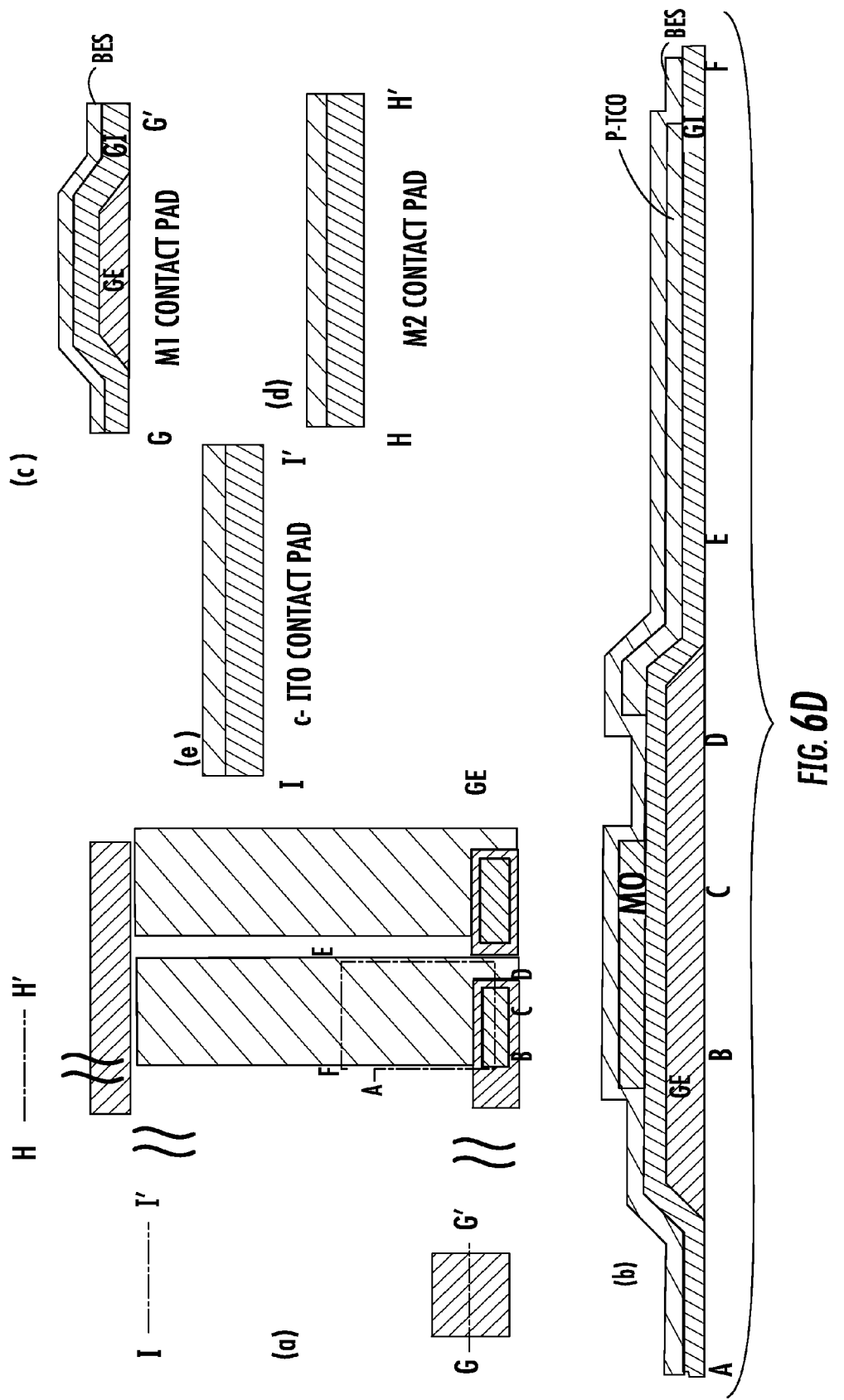

MOTFT WITH UN-PATTERNED ETCH-STOP

FIELD OF THE INVENTION

This invention generally relates to metal-oxide thin film transistors and more specifically to improved methods manufacture.

BACKGROUND OF THE INVENTION

Next generation consumer electronics calls for low cost, high performance information displays with high pixel count (resolution) and high response speed. To drive such displays, the thin film transistors (TFT) used for the pixel drivers need sufficient mobility and stability at operating conditions: with Vds typically in 0~10 v for either LCD or OLED displays. OLED displays and peripheral drivers on panel set up more rigorous requirement on TFT operation lifetime. Amorphous silicon (a-Si) based TFT cannot meet such needs due to low carrier mobility and performance instability. Low temperature polysilicon (LIPS) based TFTs cannot meet such needs due to high unit area cost and uniformity problems over large display area. High mobility metal-oxide TFTs become an attractive candidate due to their LIPS-like performance, and a-Si-like cost and uniformity. From a practical point of view, a MOTFT with a process adaptable to existing display manufacturing lines originally designed for a-Si TFT is more attractive for its short time to market and over capacity business environment.

Three types of TFTs have been used in a-Si based TFTs and MOTFTs. Two types are illustrated in FIGS. 1(a) and 1(b), which show simplified cross-sectional views each with an etch-stop (ES) layer. The type illustrated in FIG. 1(a) is commonly referred to as the "island ES-type", the type illustrated in FIG. 1(b) is commonly referred to as the "via ES-type", and the type illustrated in FIG. 1(c) is commonly referred to as the "back-channel-etching (BCE) type" TFT. In the ES type TFTs, the channel length is defined by the length of the dielectric ES between the source and drain electrodes. In the BCE type TFT, the channel length is defined by the gap between the source and drain electrodes.

The ES-type TFTs have the advantage of better protecting the channel during S/D processing. However, the ES-type TFTs have a few disadvantages: (1) they require an extra mask step to pattern the etch-stop layer; and (2) due to the alignment requirements, the minimum channel length is constrained to more than $(L_{min}+2L_{align}+2L_{tol})$, where $L_{min}$ is the minimum gap space (often called design rule) for the metal source-drain layer, $L_{align}$ is the alignment accuracy, and $L_{tol}$ is the tolerance for overlap between the S/D metal and the etch-stop. In applications with small pixel pitch, the BCE type TFT is favorable for small TFT dimensions achievable with a given design rule. However, BCE process may damage the top of channel which is more challenge in term of process control. This is especially true for a metal-oxide based channel compared to a silicon based channel.

It would be highly advantageous, therefore, to remedy the foregoing and other deficiencies inherent in the prior art.

Accordingly, it is an object of the present invention to provide a new and improved process for fabricating a stable, high mobility metal oxide thin film transistor (MOTFT).

It is another object of the present invention to provide a new and improved fabrication process with for producing MOTFTs with fewer process steps.

It is another object of the present invention to provide a new and improved fabrication process for MOTFTs that reduces the minimum channel length.

It is another object of the present invention to provide new and improved stable, high mobility metal oxide thin film transistors (MOTFT).

It is another object of the present invention to provide a low mobility metal-oxide with energy gap between 3 and 4.5 eV as the etch stop layer in MOTFT which provides sufficient electric conduction in vertical direction between S/D electrode and the channel, and provide sufficient insulation in horizontal direction.

It is another object of the present invention to provide a new and improved fabrication process for MOTFTs that includes a blanket thin film etch-stop layer on top of the channel and display pixel area with via holes for S/D contacts and electrode contact.

SUMMARY OF THE INVENTION

The desired objects of the instant invention are achieved in accordance with a method of fabricating a high mobility MOTFT including the steps of depositing and patterning a layer of amorphous or polycrystalline semiconductor metal oxide channel material, depositing a blanket layer of etch-stop material on the layer of patterned semiconductor metal oxide channel material, depositing and patterning a layer of source/drain metal on the blanket layer of etch-stop material with the patterning including etching the layer of source/drain metal into source/drain terminals positioned to define a channel area in the semiconductor metal oxide channel layer. The etch-stop material is electrically conductive in a direction perpendicular to the plane of the blanket layer at least under the source/drain terminals to provide electrical contact between each of the source/drain terminals and the layer of semiconductor metal oxide channel material. The etch-stop material is also chemical robust to protect the layer of semiconductor metal oxide channel material during the source/drain etching process and other following processes. The blanket etch-stop material also possesses sufficient insulation between source and drain electrodes and among other conductive zones in horizontal direction. Because of the blanket etch-stop layer one or more process steps are eliminated and various tolerances are either substantially eased or eliminated to allow substantial reduction in the length of the TFT channel.

The desired objects of the instant invention are also achieved in accordance with a specific embodiment of a high mobility MOTFT with a gate electrode, a semiconductor metal oxide active channel layer in amorphous, polycrystalline, or in multiple phase form, and source/drain electrodes. The MOTFT includes a blanket layer of etch-stop material positioned on the semiconductor metal oxide active channel layer. The source/drain electrodes are positioned on the blanket layer of etch-stop material on a side opposite the semiconductor metal oxide active channel layer and further positioned to define a channel area in the semiconductor metal oxide channel layer. The etch-stop material is electrically conductive in a direction perpendicular to the plane of the blanket layer at least under the source/drain terminals to provide electrical contact between each of the source/drain terminals and the layer of semiconductor metal oxide channel material. The etch-stop material is also chemically robust to protect the layer of semiconductor metal oxide channel material during the source/drain etching process and following processes needed for special applications.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1A:
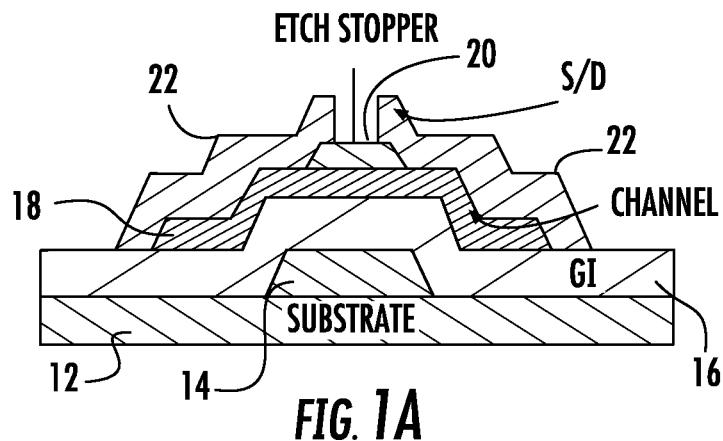
FIG. 1(a) illustrates a simplified cross-sectional layer diagram of a first etch-stop TFT generally referred to as an "island ES-type" TFT.

Turning first to FIG. 1(a), an "island ES-type" TFT is fabricated by first depositing a gate metal layer 14. The film can be formed by physical vapor deposition and patterned to the desired shape and dimension by photolithograph. The patterned gate layer can also be made with one of the printing methods known to experts in the field. A thin layer 16 of gate dielectric material is formed over gate metal 14 and the surrounding area. A channel layer 18 of semiconductor metal oxide is deposited over the upper surface of layer 16. Channel layer 18 may be a blanket layer or it may optionally be patterned, depending primarily on the final product.

One example of an "island ES-type" TFT and method of fabrication is described in U.S. Pat. No. 8,129,720 entitled "Double Self-Aligned Metal Oxide TFT", issued Mar. 6, 2012. As explained in that patent, gate metal 14 can be used as a built-in mask for the alignment of a passivation area 20. First, a passivation layer transparent to the radiation wavelengths used in the self-alignment procedure is deposited over channel layer 18. A positive working photoresist layer 30 is positioned on the passivation layer, exposed from the back surface of the substrate, and exposed portions removed. The passivation material over the exposed areas is etched away using the photoresist as a mask, generally with a light etchant or other dissolving material, with no effect on the lower surface, resulting in passivation area 20 as (ES in island form) illustrated. Source/drain terminals 22 are then patterned on semiconductor metal oxide layer 18 and a portion of passivation area 20 as illustrated.

Figure 1B:
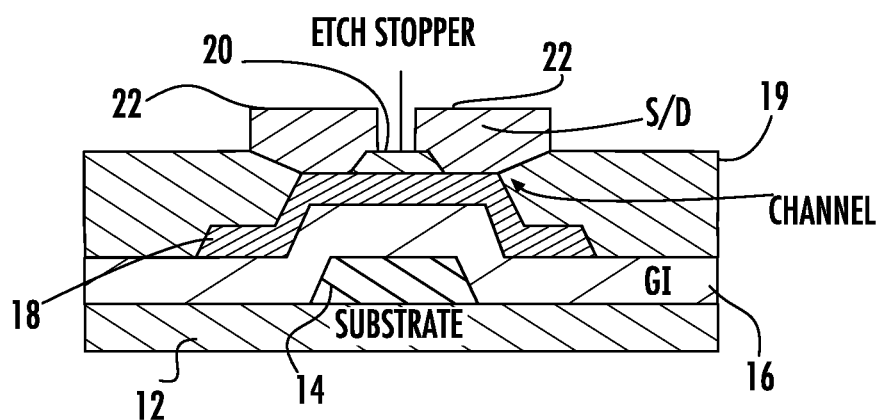
FIG. 1(b) illustrates a simplified cross-sectional layer diagram of a second etch-stop TFT generally referred to as a "via ES-type" TFT.

Turning now to FIG. 1(b), a "via ES-type" TFT is fabricated as described above through the deposition of channel layer 18 of semiconductor metal oxide. A passivation layer is deposited over channel layer 18 and etched to form source/drain vias on opposite sides of passivation area 20. As described above in conjunction with the "island ES-type" TFT, passivation area 20 overlies gate 14 and defines a channel area in semiconductor metal oxide channel layer 18. Since the source/drain vias are formed outside of the channel area (the area between the source and drain vias defines the channel of the TFT), the etching process does not damage the channel area. Source/drain terminals 22 are then deposited in the vias.

In both of the above examples, the etch-stop material is etched away in the S/D contact areas. In such a structure, a convenient dielectric material that is easy to etch is used. Typical examples are: SiN, $SiO_2$, $Al_2O_3$, or an organic dielectric material, such as acrylic polymers like Poly(methyl methacrylate) (PMMA), polydimet iutarimide (PMGI) or polyimide (PI).

Figure 1C:
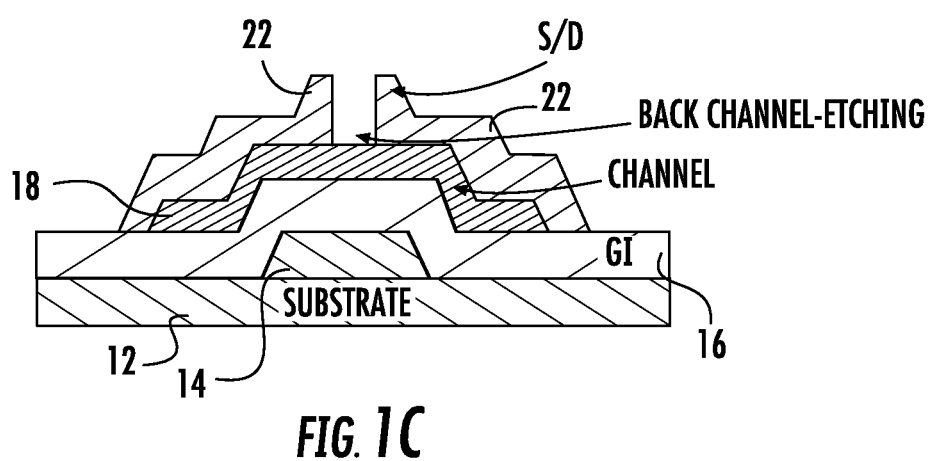
FIG. 1(c) illustrates a simplified cross-sectional layer diagram of a TFT generally referred to as a "BCE-type" TFT.

Turning now to FIG. 1(c), a "BCE-type" TFT is fabricated as described above through the deposition of layer 18 of semiconductor metal oxide channel material. A source/drain metal layer is then blanket deposited over semiconductor metal oxide channel layer 18, and then patterned by standard photolithograph patterning process (photoresist coating, exposing under photomask, developing, metal-etching and photoresist removing). In this example, the back (top) side of the channel 18 is exposed to the chemicals used in the metal-etching process. Great care and choice of etchant must be taken since the etching process is directly in contact with the channel area and can damage the channel area semiconductor metal oxide. The channel is also exposed during the following up process, typically deposition of a passivation layer over entire TFT area. Again, the exposed channel often limits the choice of the passivation materials and the corresponding process.

As can be seen from the above descriptions, disadvantages in the ES-type TFTs include one or more extra mask steps to pattern the etch-stop layer; and the minimum channel length is constrained due to alignment requirements. The channel length in the "BCE-type" TFT is defined by the open gap between source and drain electrodes. TFT with channel smaller than in ES-type can be made with the same design rule. However, the channel must survive the patterning and etching of the source/drain terminals and the following processes after that. It is in fact a great challenge for retaining MOTFT performance as good as in "ES-type".

Figure 2:
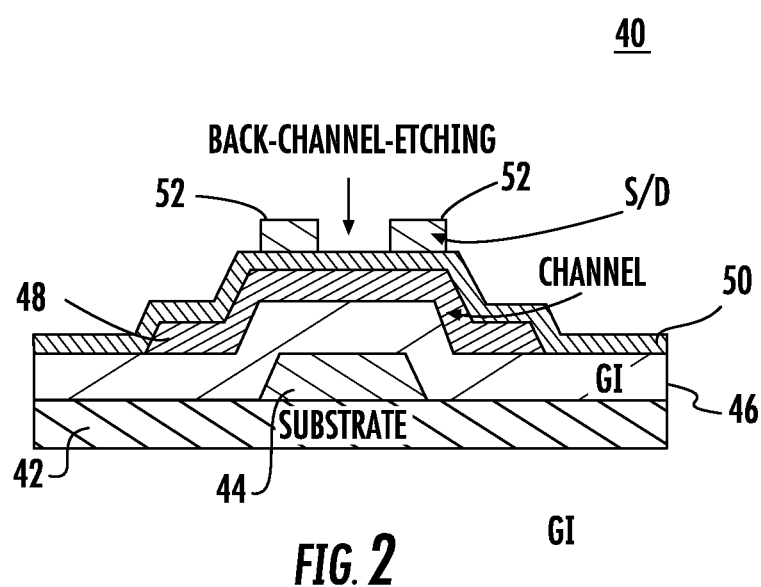
FIG. 2 illustrates a first embodiment of a stable, high mobility metal oxide thin film transistors fabricated in accordance with the present invention.

Turning now to FIG. 2, a first embodiment of a stable, high mobility metal oxide thin film transistor 40 fabricated in accordance with the present invention is illustrated. TFT 40 includes a substrate 42, a metal gate 44 positioned on substrate 42 and a thin gate dielectric layer 46 formed over metal gate 44 and the surrounding area. Substrate 42 can be, for example, glass, plastic sheet, stainless steel, or other solid sheet with a smooth surface. Gate dielectric layer 46 can include SiN, $SiO_2$, SiON, $Al_2O_3$, ZrO, HfO, or their combinations in bilayer or multiple layer form and can be deposited by PECVD, sputter, ALD, anodization, or a coating method known to experts in the field. A layer 48 of semiconductor metal oxide is deposited over the upper surface of gate dielectric layer 46. Layer 48 may be a blanket layer or it may optionally be patterned, depending primarily on the final product. A blanket layer 50 of selected etch-stop material is deposited over semiconductor metal oxide layer 48 and source/drain terminals 52 are formed on blanket layer 50.

Active semiconductor metal oxide layer 48 can be any type of semiconductor material, including Indium-Oxide (In—O), Tin-Oxide (Sn—O), Zinc-Oxide (Zn—O), Gallium oxide (Ga—O), In—Zn—O, In—Sn—O, In—Ga—O, Al—Zn—O, Ga—Zn—O, Ta—Zn—O, Ti—Zn—O, In—Ga—Zn—O, In—Ga—Sn—O, In—Al—Zn—O, In—Al—Sn—O, In—Ta—Zn—O, In—Ta—Sn—O, and their combinations in blend form or in multiple layer form. Any of these materials can also be in gradient form such as starting from a composition with higher carrier density near or adjacent gate dielectric layer 46 and gradually reducing the carrier density to a composition more chemically tolerant to the post processes above the channel area or layer. Examples of such structure (e.g. a bilayer channel with a $1^{st}$ layer including Al—Zn—O with low aluminum content and a $2^{nd}$ layer with high aluminum content) are disclosed in a copending United States patent application entitled "High Mobility Stable Metal Oxide TFT", application Ser. No. 13/536,641, filed Jun. 28, 2012, and incorporated herein by reference.

The channel layer can be in amorphous, crystalline, single-phase or multiple-phase forms. With a metal-oxide channel layer the Fermi energy resides in ns orbital with n>4, the Fermi energy possesses a spherically outer shell and the mobility of a TFT fabricated from it shows electron mobility insensitive to its crystalline structure, or grain boundaries. When bilayer or multiple layer channels are adopted for the channel layer, one could construct a designed layer sequence by molecular composition, or by crystalline structures of different layers to optimize both electronic performance and environmental stability during process and post operation.

The etch-stop material of blanket layer 50 is selected: (1) to provide vertical conduction beneath source/drain terminals 52 for good ohmic contact between source/drain terminals 52 and semiconductor metal oxide layer 48; and (2) to provide good etch-stop characteristics and channel protection during the source/drain metal terminals 52 deposition and patterning, and (3) to provide sufficient lateral insulating between source and drain electrode, and other conductive wires in connection, as will be explained in more detail below.

In the preferred embodiment a class of wide band semiconductor materials is used for the selected etch-stop blanket layer 50. Also, the process includes steps to form high carrier density and conductive zones in etch-stop blanket layer 50 between S/D terminals 52 and semiconductor metal oxide layer 48, and an insulating state the areas without S/D metal. The conductive zones guarantee carrier transport through the channel between the source and drain terminals, the chemical robustness of the etch-stop blanket layer 50 prevents the channel layer from the chemical environment used for S/D patterning.

Specifically it has been found that a class of metal oxides with energy gap in range of 3 eV-4.5 eV can be used as an etch-stop blanket (BES) layer 50 for the above purposes. Some examples include Ta—O, Ti—O, V—O, Hf—O, Zr—O, Pa—O, Cr—O, and Ni—O. In addition to metal oxide, metalloid-oxide, or metalloid-oxidenitride such as $SiO_x$, $SiO_x$:N can also be used. Generally, these examples are characterized by a Pilling-Bedworth (PB) ratio larger than 1 (PB ratio is volume ratio between oxide and corresponding metal or metalloid). Oxides with PB ratio larger than 1 form a dense oxide layer at its interface to ambient, especially at elevated temperatures. These oxides function as a good chemical barrier against chemicals used for source/drain etching and subsequent processes. Such metal-oxide or metalloid-oxide thin films can also tunnel electrons in a direction perpendicular to its surface, and provide sufficient insulation in a direction parallel to its surface.

Certain n-type organic materials can also be used for etch-stop blanket layer 50, for example, Alq, BAlq, graphene type carbon molecules including buckyball, C60 and its derivatives. These materials all form sufficient insulation in the horizontal direction in distances of a few microns apart (generally the channel length in present day TFTs). They can also provide sufficient electron conduction in vertical direction, especially in n-doped form. Such doping can be achieved with proper selection of the interfacing layer at the S/D metal contact along with proper post annealing process, similar to those used for the n layer in organic p-i-n diodes.

Many processes can be used to form such films, including sputtering, plasma-enhanced chemical vapor deposition, MOCVD, atomic layer deposition (ALD). In a preferred process, the blanket metal-oxide film can be formed with passive or reactive sputter under RF or AC power sources, under an oxygen deficient condition. The oxygen deficiency underneath patterned S/D areas is preserved during the subsequent annealing, while the metal-oxide film is fully oxidized in other areas. The oxidation in areas without S/D metal guarantees the electric insulation in the horizontal direction including the channel areas. In a preferred sputter process, the layer is formed with a sputter target prepared in desired composition and sputtered under inert gas environment. It is sometimes called "passive sputter process". In yet another preferred procedure, the blanket metal-oxide ES film can be processed in relatively oxidized condition, for example, sputter in the presence of partial $O_2$ pressure. The sputter target used for this case can be a metal-oxide target with oxygen deficiency, or even a metal target. Such process is sometimes called reactive sputter. A proper post annealing to the as processed blanket metal-oxide ES film in ambient or in a controlled environment (such as under N2 gas) can be used to optimize the chemical robustness of the BES layer for S/D process while retaining the conductivity for the source/drain contacts.

In addition to deposition methods involving vacuum pumping down, a coating method can also be used by means of an organo-metallic or inorganic precursor solution along with subsequent annealing in oxygen ambient. Copending US patent application, entitled "Metal Oxide TFT With Improved Stability", filed 29 Oct. 2010, bearing application Ser. No. 12/915,712, incorporated herein by reference, discloses a series of organo-metallic compounds which could be used for such purpose.

A reactive metal is then deposited as the interface layer of the S/D metal stack. Some examples of such reactive metals include Ti, Mo, Ta, V, W, Al, Cu, and their combinations in stack or alloy form. Annealing before and or after S/D patterning can improve the conduction due to metal diffusion into the blanket metal-oxide film, or oxygen diffusion into the S/D layer. Such diffusion process creates an N+ layer and provides the needed conductance at the source/drain-to-channel interfaces. When the annealing is carried out after S/D patterning, it is preferred in an oxygen ambient. A trace amount of $H_2O$ may also be used to optimize the annealing efficiency.

Either a wet etching process or a dry etching process can be used for patterning the S/D metal layer to form S/D terminals 52, depending on the detail metal or metal stacks used. For example, wet etching is often used for Mo/Al/Mo stack while dry etching is often used for Ti/Al or TiW/Al stacks. The Al layer can be replaced with an Al alloy to improve the etching compatibility, or structural stability during the post process. For large size, display applications, the Al layer can be replaced with a Cu or Cu alloy (such as Cr:Cu) known to experts in the field. It should be understood that throughout this disclosure the term "metal layer" is used for convenience of understanding when describing the source/drain metal material even though the "layer" may include multiple layers of material or multiple materials graded into one or more layers. Thus, the term "layer of source/drain metal" or "source/drain metal layer" is defined to include any combination of metals used to form the source/drain terminals.

The typical thickness of the blanket ES layer 50 is in a range of 5-100 nm. In certain applications with high TFT current, blanket ES layer 50 is in a preferred range of 5-30 nm. With proper selection of the MO material for the blanket ES layer 50, proper selection of metal or metals used for S/D terminals 52 above ES layer 50, and proper post S/D annealing at an elevated temperature to oxidize the exposed portions of ES layer 50 and to form an n+ layer at the interface under S/D contact areas, sufficient conductance of blanket ES layer 50 between S/D terminals 52 and semiconductor metal oxide layer 48 can be achieved, and sufficient insulation of blanket ES layer 50 in the horizontal direction for complete shut-off in $I_d$-$V_{gs}$ performance can be achieved. Examples of MOTFT with structure disclosed in FIG. 2 are provided in a later portion of this discloser.

Figure 3:
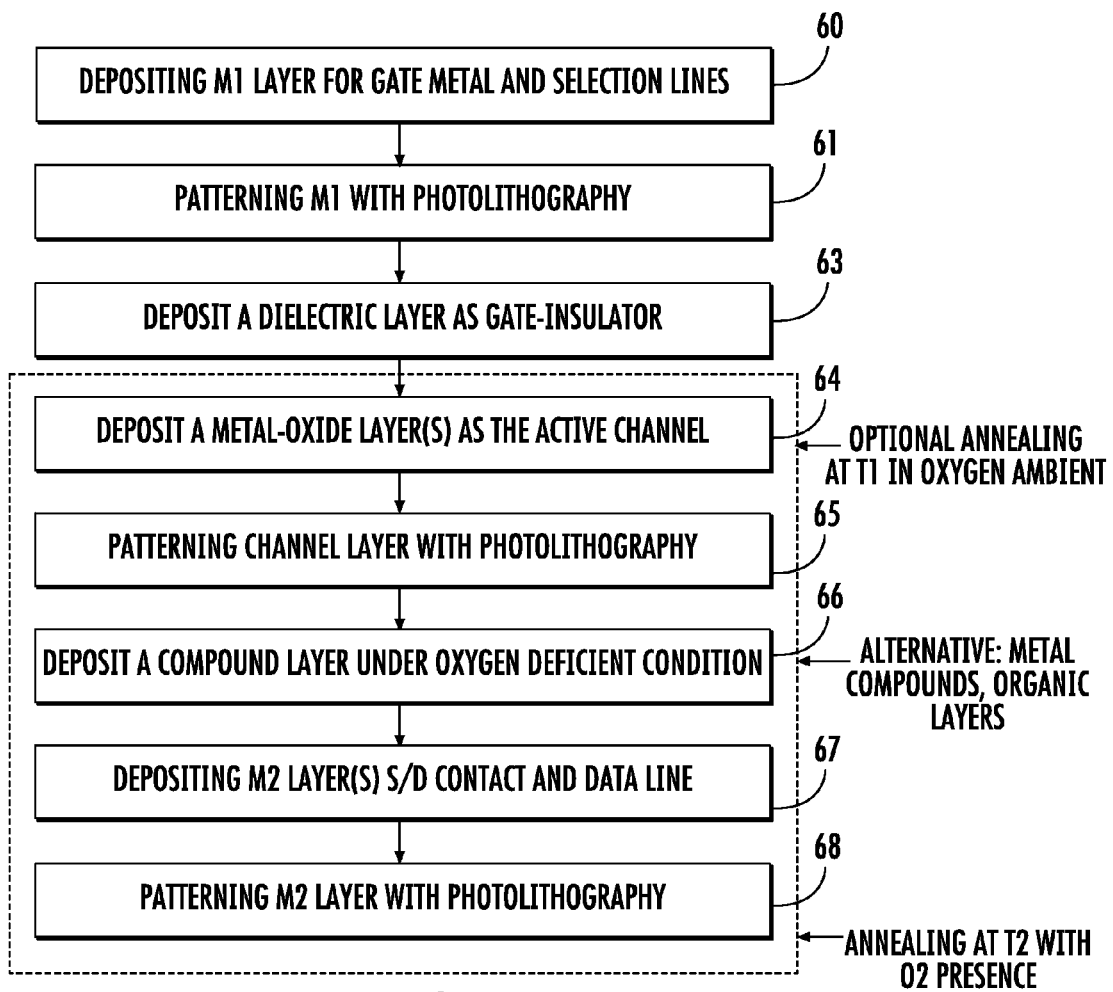
FIG. 3 illustrates a flow chart for the fabrication of the TFT of FIG. 2.

Turning now to the flow chart illustrated in FIG. 3, steps in a preferred method for the fabrication of the TFT of FIG. 2 are described. In a first step, designated 60, a gate metal layer is deposited on substrate 42. In a second step, designated 61, the gate metal layer is patterned to define metal gate 44, in this example, using photolithography. Since the position of metal gate 44 is not critical virtually any non-critical patterning technique can be used. It will be understood by those of skill in the art that in addition to or instead of forming metal gate pattern 44 with a proximity or a projection tool, the gate pattern can be formed with any of the various well known printing processes mentioned above, including imprinting or off-set printing methods. In a step, designated 63, thin gate dielectric layer 46 is then deposited as a blanket layer over metal gate 44 and the surrounding area.

In a step designated 64, layer or layers 48 of semiconductor metal oxide is deposited as a blanket layer over the upper surface of gate dielectric layer 46. Layer or layers 48 are then patterned in step 65, using any non-critical patterning technique, to define the limits of TFT 40 and separate it from adjacent TFTs. At some point before and/or after step 65, an optional annealing step at an elevated temperature in an oxygen ambient may be performed. By annealing the structure in an oxidizing ambience at an elevated temperature (e.g. >160° C.) an area adjacent the upper surface (or an upper layer) of layer or layers 48 can be oxidized to move the threshold toward the positive direction and achieve the optimized performance in the completed TFT.

With layer 48 patterned to define TFT 40 and separate it from adjacent TFTs, in this preferred process a blanket layer of a selected compound material is deposited under oxygen deficient conditions to form etch-stop layer 50 in a step designated 66. As explained above, layer 50 can include any of the various materials mentioned in one or more layers and deposited by any of the processes described. It should also be noted that while layer 50 is initially deposited as a blanket layer it can be patterned, using any non-critical patterning technique, if desired to limit the specific layer 50 to the entire TFT 40. Even when non-critical patterning is involved, ES layer 50 is still considered to be a blanket layer for TFT 40.

As mention before, the layer 48 can be formed with a vacuum deposition method known to the expert in the field, for example, by means of sputter or a CVD such as atomic layer deposition. In one of the preferred processes, such deposition is done at low temperature (such as room temperature), under low or zero oxygen partial pressure. Blanket ES formed under such conditions can lead to n+ conduction in zones underneath S/D metal area and fully oxidized insulation in areas without S/D metal. An optimized conduction in the S/D area can also be done by adjusting deposition power (and thus the morphology of the blanket ES layer). Other methods to optimize the S/D-to-channel contact include tuning the morphology of the top channel surface by deposition conditions, by a surface treatment or by other processes known to experts in the field.

An S/D metal layer, selected to ultimately form S/D contacts and data lines connected to at least one of the contacts, is deposited over etch-stop layer 50 in a step designated 67. It will be understood from the above descriptions that the S/D metal layer may be in the form of a stack (i.e. multiple layers) or any of a variety of gradients or alloys. Following the deposition, in a step designated 68, the S/D metal layer is patterned, preferably using photolithography, to define S/D contacts 52 and any connecting data lines, power lines or the like. Once the patterning is complete an optional annealing step may be performed in the oxygen ambient to oxidize the exposed portions of ES layer 50. Also, the annealing process improves the electrical contact between S/D contacts 52 and semiconductor metal oxide layer 48 by at least one of diffusing metal from S/D contacts 52 into ES layer 50, diffusing oxygen from ES layer 50 into S/D contacts 52, and/or forming an n+ layer at the interface under S/D contacts 52. The full oxidization in exposed portions of ES layer 50 can also optimize the electrical insulation in these areas.

The S/D forming by blanket deposition with following etch-patterning is a type of removing processes. The S/D layer can also be made by an add-on process known to experts in the field. Such add-on process may eliminate a photo-patterning process and the corresponding cost. U.S. Pat. No. 8,435,832 discloses several types of add-on S/D metal processes including printing, electroless plating, and laser transferring. The blanket ES layer disclosed in this invention can be used as the channel protection during such add-on source/drain metal processes. It is worth mentioning specifically that high conductivity source/drain electrodes, data lines, or even power lines in a display can be formed with the Cu plating process disclosed in U.S. Pat. No. 8,435,832.

In certain applications, additional dielectric layers and pixel electrode layers are needed on top of the S/D layer. For example, one may need another layer on top of S/D electrodes for electric insulation, for additional passivation, or for special applications. An example for a backpanel used for IPS-LCD is provided in a later portion of this disclosure. The post s/d layer annealing step may be combined with annealing steps in these following processes.

Figure 4:
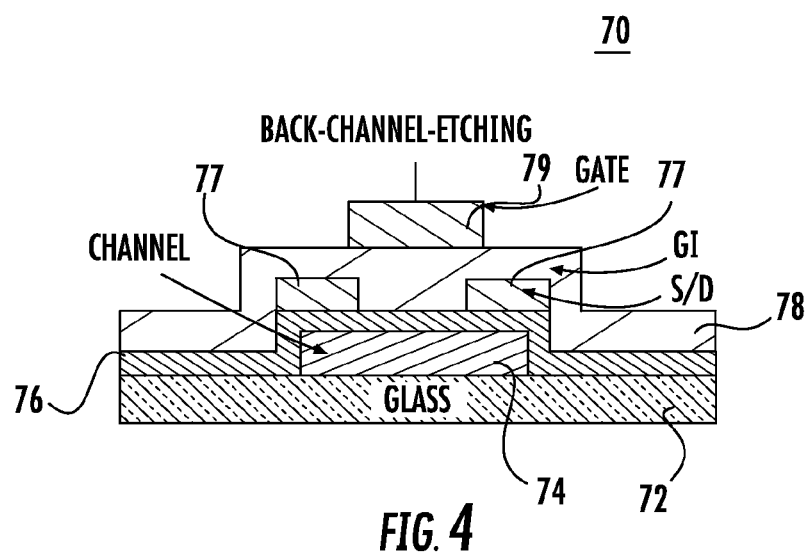
FIG. 4 illustrates a second embodiment of a stable, high mobility metal oxide thin film transistors fabricated in accordance with the present invention.

Turning now to FIG. 4, a second embodiment of a stable, high mobility metal oxide thin film transistor 70 fabricated in accordance with the present invention is illustrated. TFT 70 is a top S/D, top gate type of transistor. TFT 70 includes a substrate 72 with a channel layer 74 of metal oxide semiconductor material deposited and patterned thereon. A blanket layer 76 of etch-stop material is deposited over channel layer 74 and the surrounding area. The typical thickness of the blanket ES layer 76 is in a range of 5-100 nm. In certain applications with high current density, blanket ES layer 76 is in a preferred range of 5-30 nm. S/D contacts 77 are then deposited and patterned on etch-stop layer 76 to define a channel area therebetween. A layer 78 of gate dielectric material is deposited over S/D contacts 77 and the surrounding area and a metal gate 79 is deposited in overlying relationship to the channel area defined between S/D contacts 77. All of the materials, deposition processes, and structure described in conjunction with TFT 40 of FIG. 2 apply similarly to TFT 70. It is worth pointing out that the blanket ES layer 76 does not only provide effective channel protection during S/D deposition and patterning, but also provides protection to the channel area during the following gate insulator (GI) deposition. The structure disclosed in this invention broadens the choice of the GI layer process method, as well as process conditions.

For example, a PECVD process on top of the metal-oxide channel layer has been one of the challenges in the field, the structure in FIG. 4 provides a perfect solution and enables the SiN and SiO2 processes existing in current a-Si manufacture lines to be used for the layer 77. Moreover, because a better GI layer can be achieved for the MOTFT in FIG. 4, the metal choice and patterning process conditions can be broadened substantially. For example, thick Cu metal can be used for the gate layer 79. With via-holes through the GI layer 77, one could achieve high conductivity for gate lines, data lines and even power lines in cases for light emitting displays (LED). The device structure disclosed in FIG. 4, thus, enables large size displays with high pixel count, high frame time, high gray bit and high display uniformity.

U.S. Pat. No. 7,605,026 (4674-A12) discloses a top-gate MOTFT with a self-aligned process. U.S. Pat. No. 8,435,832 (4674-A17CI1) discloses a method of making high conductivity metal lines for MOTFT by forming a transparent/semi-transparent seed layer for plating with self-aligned process and then forming high conductivity metal lines on top of the seed layer. Combining these processes, one could make high conductivity metal layer 79 of TFT 70 by means of plating.

U.S. Pat. No. 8,435,832 also discloses a method of forming high conductivity metal lines in a MOTFT by add-on processes such as printings. With proper surface priming to form different surface properties, one could achieve a high conductivity metal layer in desired patterns with simple coating techniques. The MOTFT disclosed in FIG. 4, thus, enables forming high conductivity metal layer 79 with all types of forming processes including PVD, plating, printing and coating.

It is worth pointing out that the channel length in a TFT having a traditional ES layer made with dielectric material is defined by the dimension of the ES layer. The invention of using broad band n dope-able metal oxide as the blanket ES layer provides a MOTFT with a channel length defined by the space between the source and drain electrodes, i.e., TFTs with the same dimensions as that in a TFT fabricated using the BCE process. The MOTFTs disclosed in this invention are, thus, of high performance as good as achieved with the traditional ES type TFT, but also of the same mask steps and channel length as those in a TFT made with the BCE process.

Figure 5:
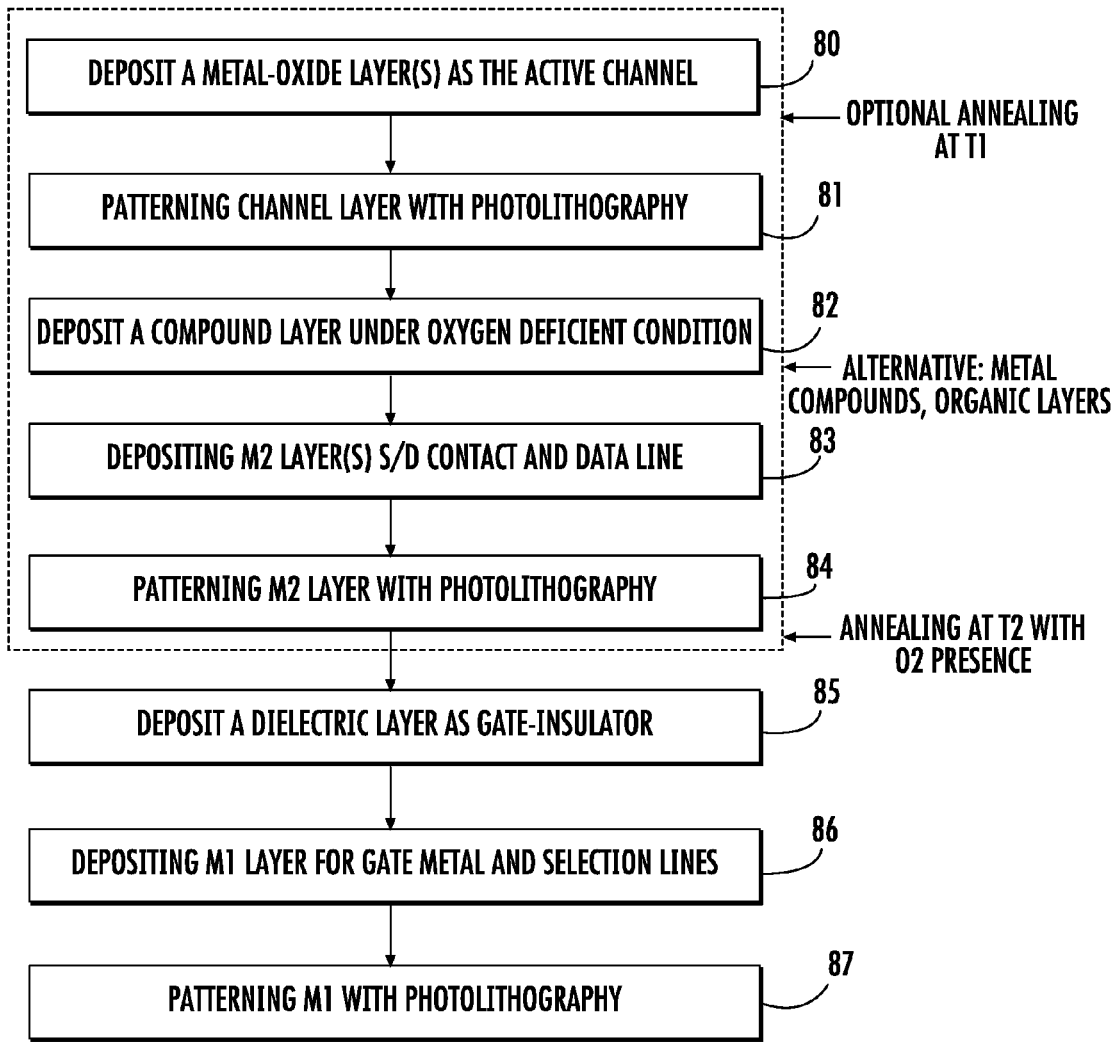
FIG. 5 illustrates a flow chart for the fabrication of the TFT of FIG. 4.

Turning now to the flow chart illustrated in FIG. 5, steps in a preferred method for the fabrication of TFT 70 of FIG. 4 are described. In a first step, designated 80, a blanket layer of metal oxide semiconductor material is deposited on substrate 72. In a second step 81 the blanket layer of MO material is patterned using any non-critical patterning technique, in this example preferably using photolithography, to define channel layer 74. At any convenient time in or between steps 80 and 81 an optional annealing step at an elevated temperature in an oxygen ambient may be performed. By annealing the structure in an oxidizing ambience at an elevated temperature (e.g. >160° C.) an area adjacent the upper surface (or an upper layer) of layer or layers 74 can be oxidized to a level with desired carrier concentration. Since the metal-oxide channel layer is the first layer on the substrate, the channel forming method and environmental conductions can be broader than that described in FIG. 2, practically with little or no restriction.

In the next step, designated 82, a blanket layer 76 of selected etch-stop material is deposited under oxygen deficient, or oxygen-free environments over semiconductor metal oxide channel layer 74 and the surrounding areas. All of the materials, and deposition processes described in conjunction with etch-stop layer 50 of TFT 40 apply similarly to etch-stop layer 76. It should also be noted that while layer 76 is initially deposited as a blanket layer it can be patterned, using any non-critical patterning technique, if desired to limit the specific layer 76 to TFT 70. Even when non-critical patterning is involved (i.e., covering the entire TFT area), ES layer 76 is still considered to be a blanket layer for TFT 70

An S/D metal layer, selected to ultimately form S/D contacts and any connecting data lines is deposited on etch-stop layer 76 in a step designated 83. It will be understood from the above descriptions that the S/D metal layer may be in the form of a stack (i.e. multiple layers) or any of a variety of gradients or alloys. Following the deposition, in a step designated 84, the S/D metal layer is patterned, preferably using photolithography, to define S/D contacts 77 and any connecting data lines or the like. Once the patterning is complete an optional annealing step may be performed in the presence of oxygen to at least one of diffuse metal from S/D contacts 52 into ES layer 50, diffuse oxygen from ES layer 50 into S/D contacts 52, and/or form an n+ layer at the interface under S/D contacts 52 and to oxidize the exposed portions of ES layer 76. This annealing will also finally turn the channel area between S/D electrodes to a more oxidized state with carrier concentration needed for the TFT.

In a step 85, thin gate dielectric layer 78 is deposited over S/D contacts 77 and the surrounding area. In a following step, designated 86, a gate metal layer is deposited on dielectric layer 78. In another step, designated 87, the gate metal layer is patterned to define metal gate 79, in this example, using photolithography. Since metal gate 79 must overlie the channel area defined between S/D contacts 77, a self-aligning process (e.g. the process described in the above cited US patents) is preferably used in the patterning step.

TFTs with structures and processes disclosed in FIG. 2-5 can be used to construct thin film electronic circuits. An example of using the TFT structure shown in FIG. 2 to construct an AMLCD pixel driver array with in-plane-switching type liquid crystal is shown in FIG. 6. This circuit can be made with 6 mask steps, in contrast to 7-9 mask steps currently used for a-Si TFT based AMLCD displays.

Figure 6A:
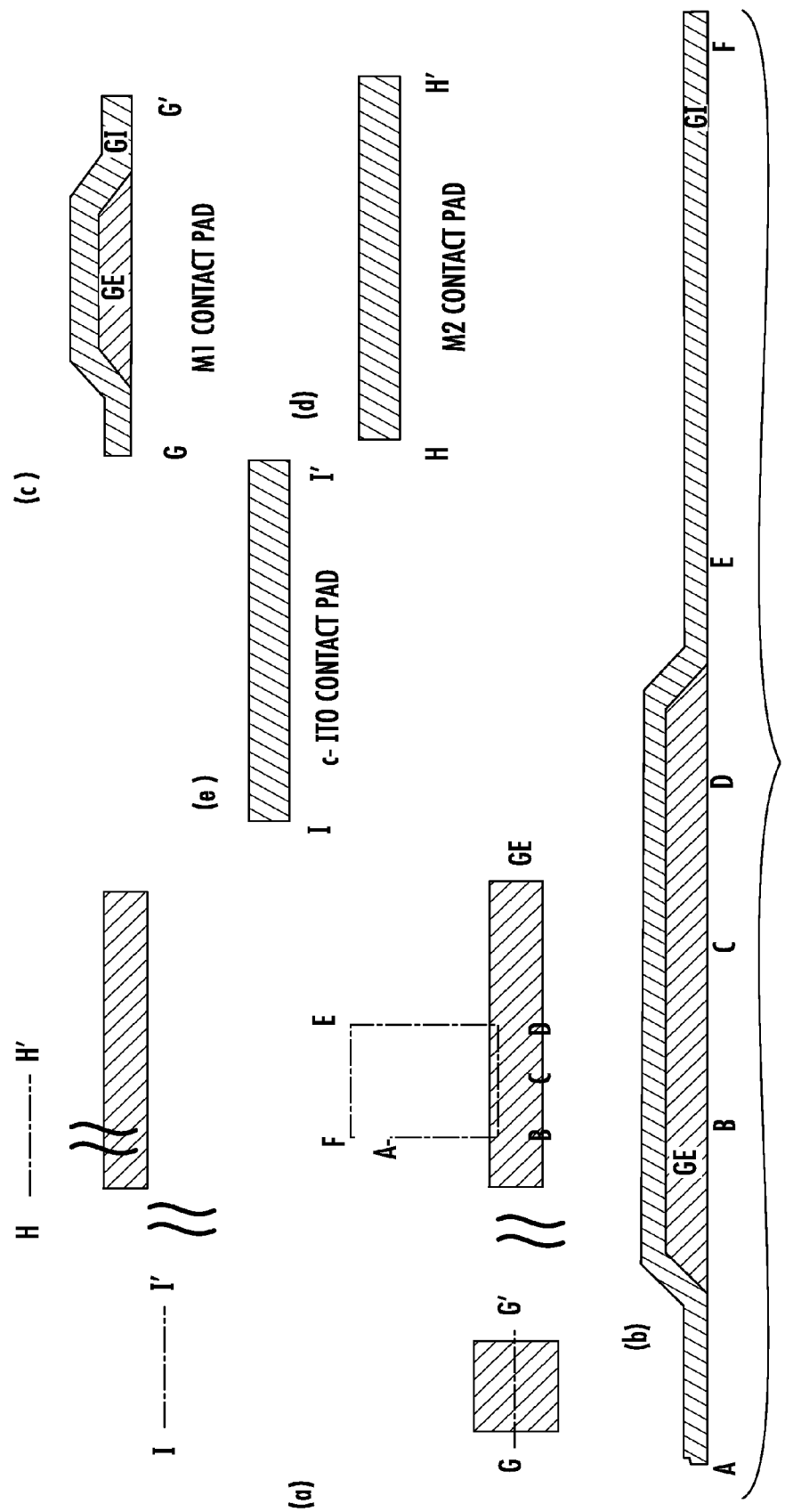
FIG. 6 shows top view and cross-section views of pixel drivers in active display area, and the contact pads surrounding edge area and represents a complete backpanel for IPS AMLCD displays, A through G, illustrate seven consecutive steps in the fabrication process.

FIG. 6A shows a top plan view (a) of two pixels and the corresponding cross-section view (b) of layer structure following the trace marked from A to F. The cross section views of the contact pads out of the display area are shown views (c), (d), and (e). Gate metal is deposited on a flat substrate (marked with a solid line in (b). It is patterned with a first lithography mask and forms a pattern of the gate electrode, marked as "GE". A dielectric layer or gate insulator (GI) is then deposited over the gate electrode.

Each of FIGS. 6B through 6G illustrate steps in the fabrication process sequential following the steps illustrated in FIG. A. Further, each of FIG. B through FIG. G illustrate the same top view (a) of two pixels and the corresponding cross-section view (b) of layer structure following the trace marked from A to F as well as the cross section views of the contact pads out of the display area shown in views (c), (d), and (e). The various top plan and cross-sectional views are illustrated in a single figure for a better understanding of the structure.

Figure 6B:
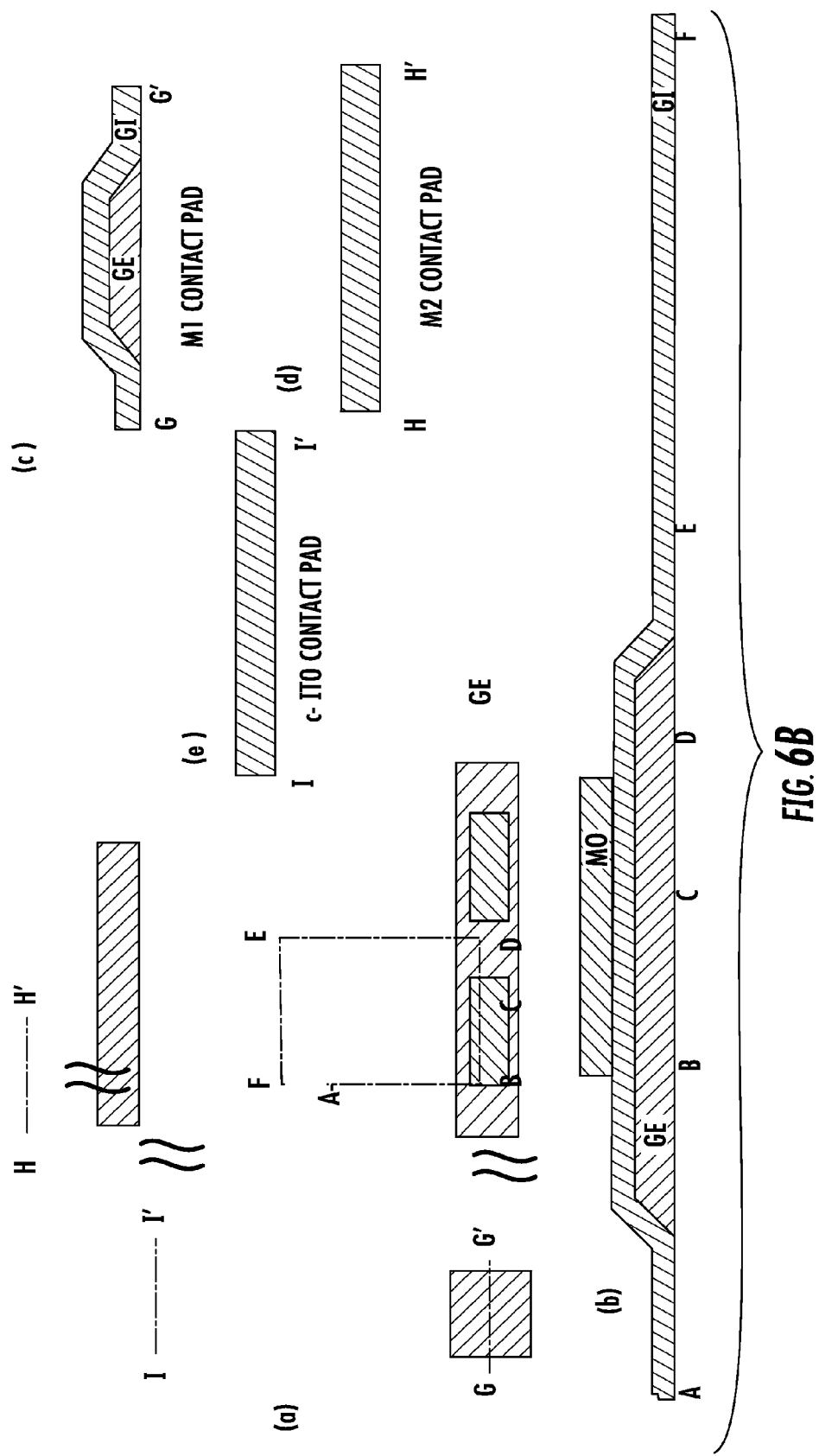
Figure 6C:
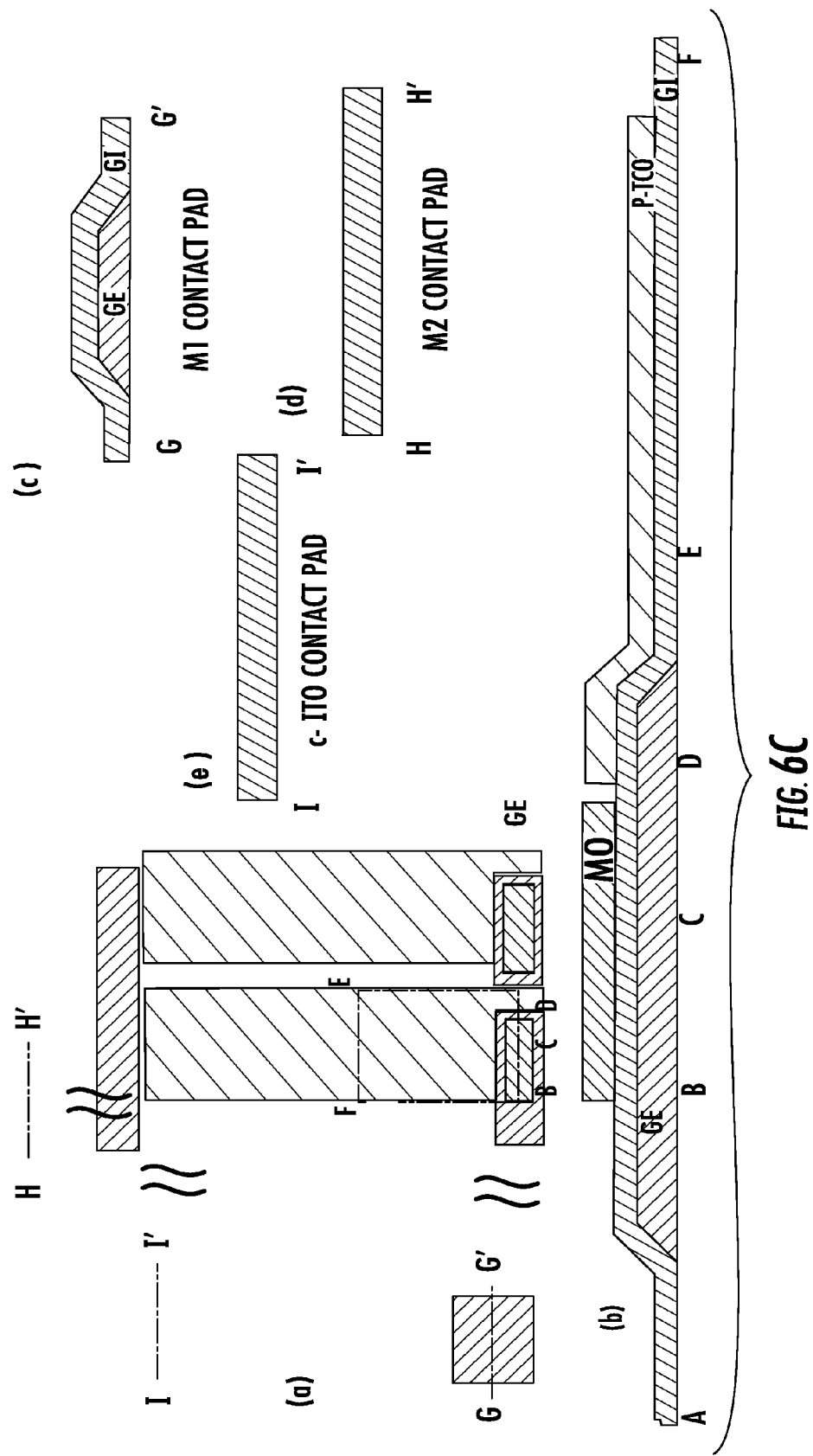

FIG. 6B shows the next process step: metal oxide channel deposition and patterning with a $2^{nd}$ photo mask. The channel forming pattern is marked as "MO". The next process step is shown in FIG. 6C: the pixel transparent conductor oxide (P-TCO) deposition and patterning using a photo mask 3. The order of the process step illustrated in FIG. 6B and the process step illustrated in FIG. 6C can be reversed, depending upon details such as material selected and process convenience. U.S. Pat. No. 8,187,929 and copending U.S. patent application Ser. No. 13,481,781 disclose methods of forming the metal oxide (MO) channel and pixel electrodes with a single metal oxide material and with a single patterning step. Similar concepts can be used for forming MO and p-TCO patterns illustrated in FIGS. 6B and 6C with a single mask step. One more mask can be saved in this approach. For consistence, the following processes are described assuming the process step illustrated in FIG. 6B and the process step illustrated in FIG. 6C are done with two mask steps.

Figure 6E:
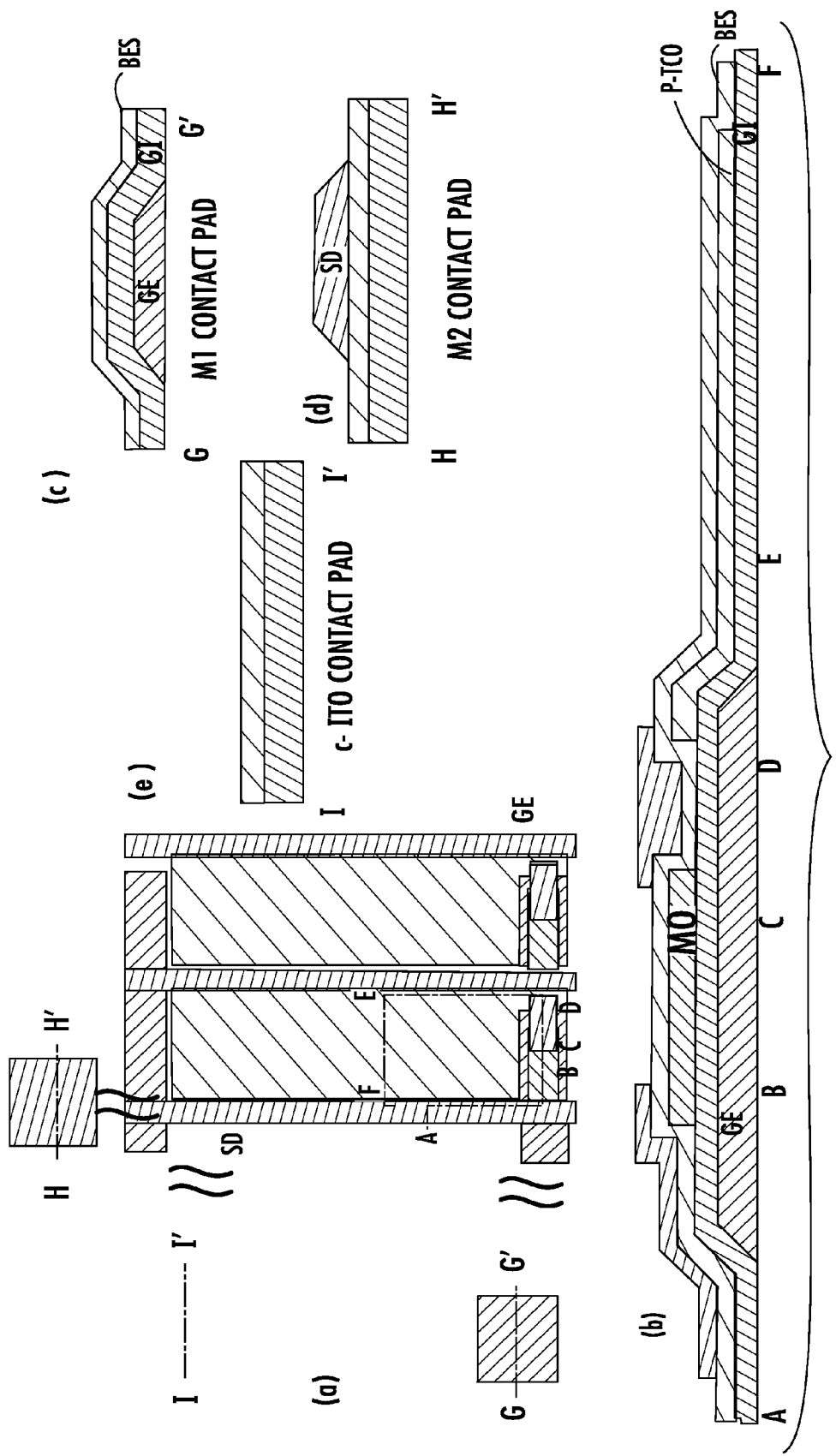
Figure 6F:
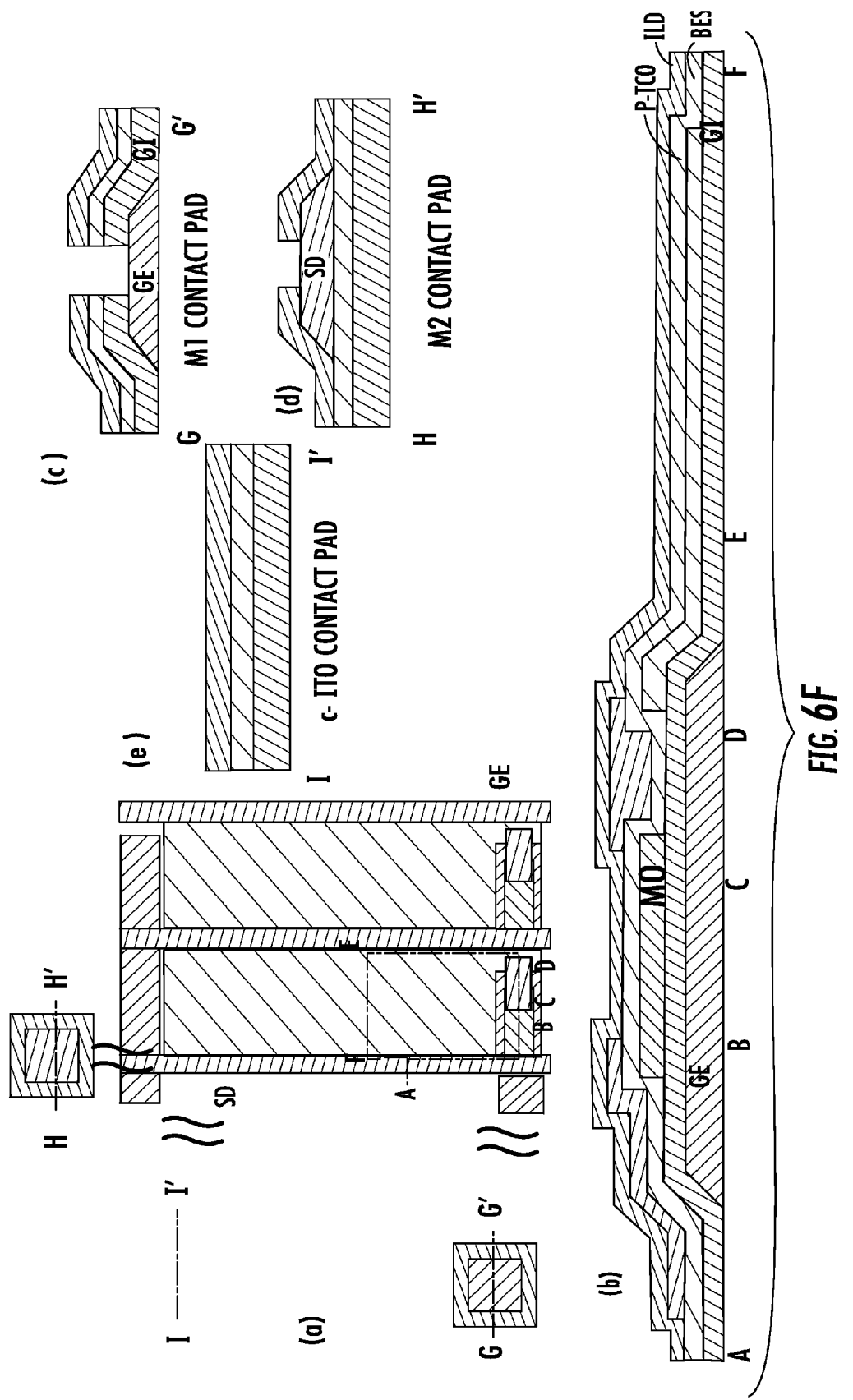
Figure 6G:
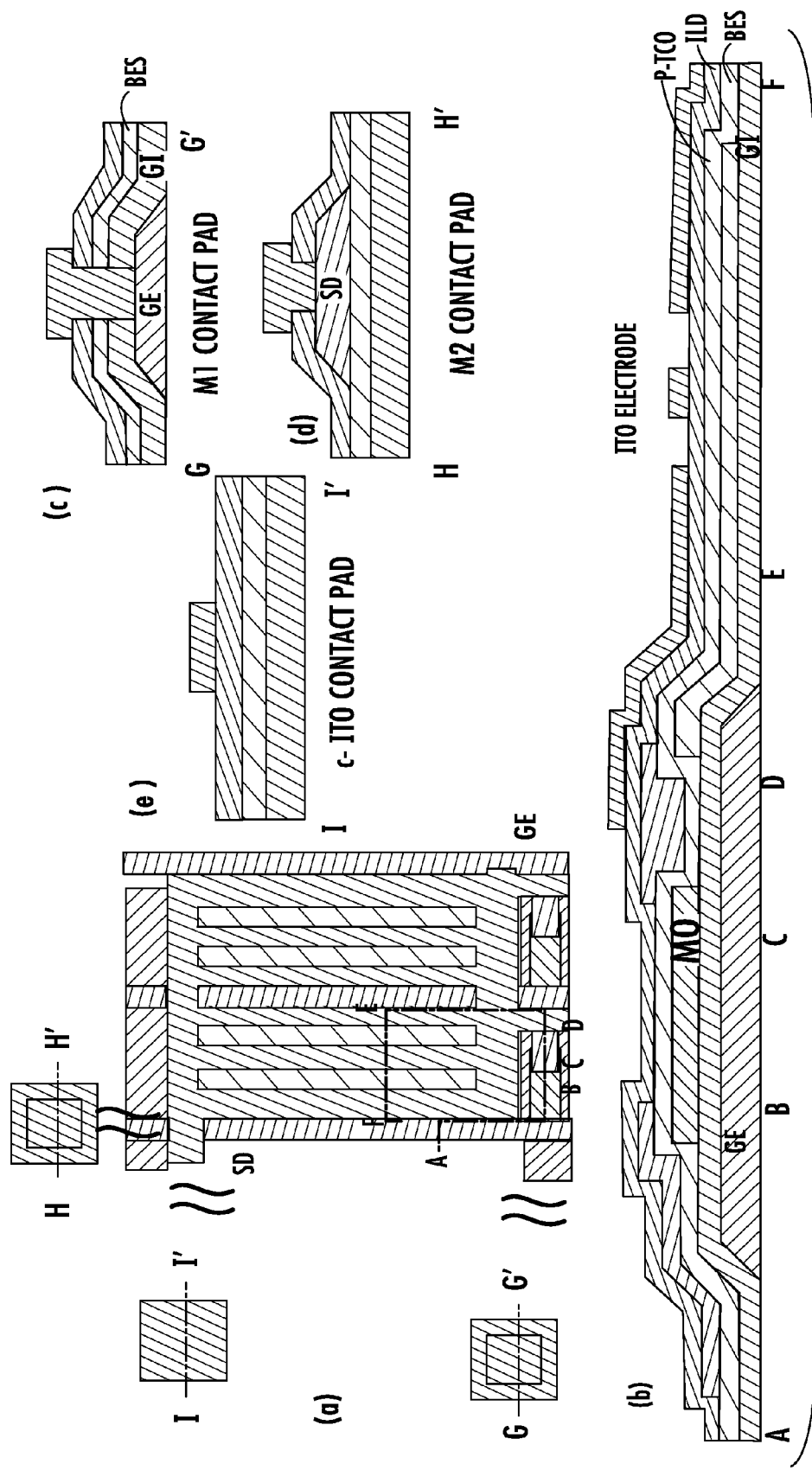

The next process: a blanket etch stopper (BES) deposition is shown in FIG. 6D. FIG. 6E shows the formation of a source/drain electrode and data line using a forth mask. The next step, illustrated in FIG. 6F, is the formation of an interlayer dielectric (ILD) followed by via hole patterning by means of dry or wet etching in the contact pad areas (c) and (d). It is worth mentioning that via holes through the interlayer, the BES and the gate dielectric layer can be formed by etching through with a single etching process, as shown in the zone G-G' view (c) of FIG. 6F. The interlayer is not drawn in the top plan of the pixel area for simplicity of understanding. The top TCO layer is used as a common electrode in the backpanel circuit. Patterns of the top TCO layer in different areas are shown in FIG. 6G which is achieved with a sixth photo mask.

Because the bottom pixel transparent conductive oxide (P TCO) electrode is sandwiched between the BES and GI layers (see FIG. 6D), the p-TCO layer can be as large as the entire transparent window defined by data and gate metal lines. The structure disclosed in FIG. 6 provides an AMLCD with an aperture ratio as large as those that are previously only achieve-able with a TFT comprising a thick planarization layer.

Although the structure shown in FIG. 6 describes an IPS-AMLCD with top common electrode, one could also construct an IPS-AMLCD with bottom electrode as the common electrode following the same layout principle. When constructing an IPS-AMLCD with bottom electrode, a via hole through the interlayer (ILD) is needed to connect the top pixel TCO pad to the drain metal pad which can be achieved with mask 5 shown in FIG. 6F.

The entire TFT in FIG. 6 overlies completely on top of the gate metal (GE). It has found that topological steps or roughness in source/drain contact areas, herein defined as "non-planar" areas for simplicity, can improve the contact conductance. This is especially useful in applications that require high pixel current or in small size TFTs with limited contact area. Such non-planar areas can be achieved with step structures patterned in the gate metal layer.

Figure 7:
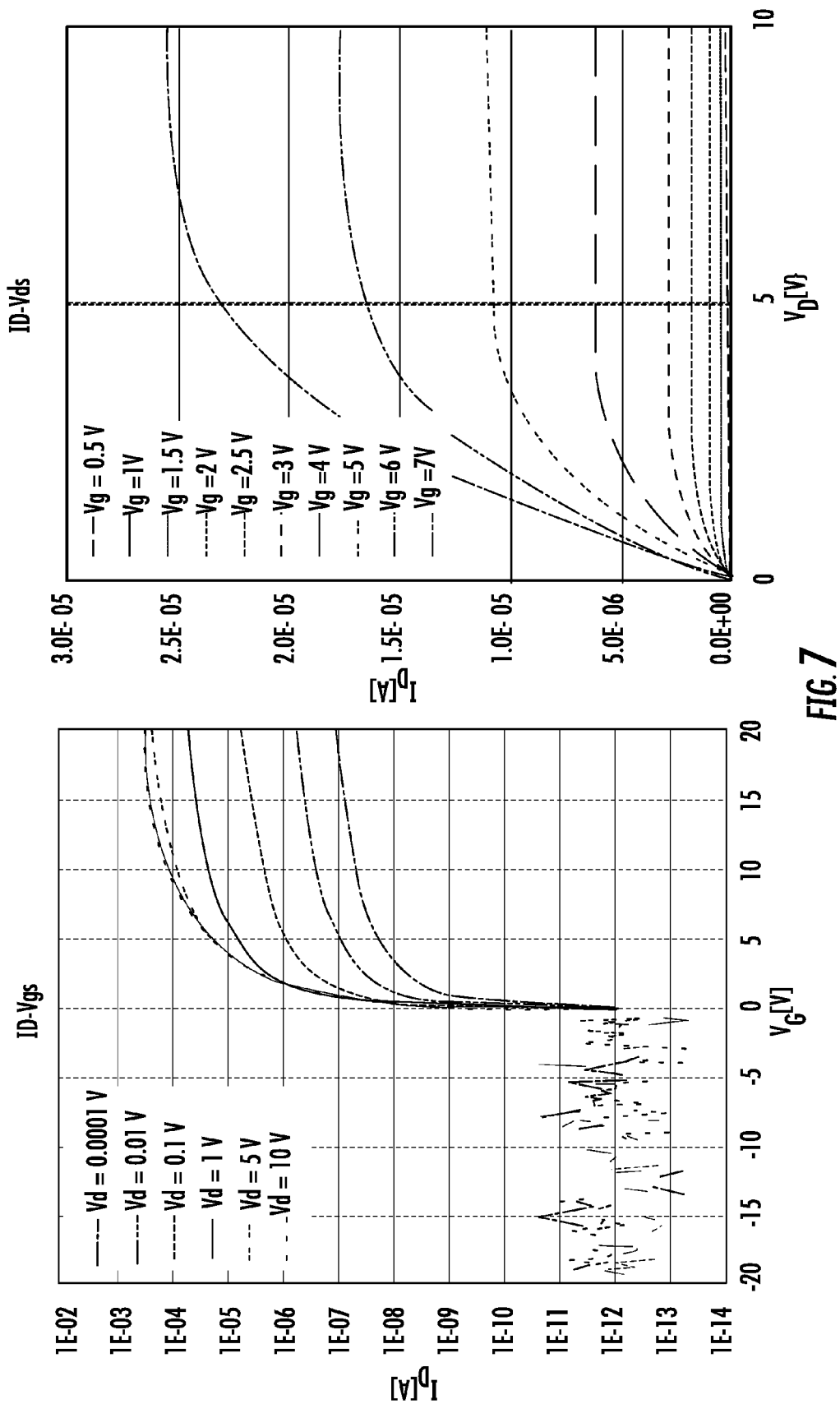
FIG. 7 shows a set of Id-Vgs and Id-Vds curves from a MOTFT with the structure shown in FIG. 2.

As an example, FIG. 7 shows a pair of Id-Vgs and Id-Vds from a BES MOTFT with a structure similar to that shown in FIG. 2. The channel width and length of the BES MOTFT tested were 25 μm and 7 μm, respectively. The channel layer was made of In—Zn—O with In—O to Zn—O weight ratio of 1:1. A blanket Ta—O layer was used for the BES with a thickness of 10 nm. The sub-threshold swing was ~0.2V and ON/OFF current ratio at off-current is beyond $10^8$ at 10V. The scaling effect was observed in TFTs with channel lengths and widths down to 2 μm. Also, a superb output impedance of 90MΩ for Id at 2 μA. was noted. Such performance is especially attractive for pixel drivers in emissive displays (e.g., display pixel elements made of organic light emitting diodes or inorganic LEDs). The high output impedance in the Id-Vds plot enables uniform display intensity over large size displays in which pixel current changes from display edge to display center area is less sensitive to the voltage drop on Vdd power buslines. By replacing the metal oxide channel layer with different compositions, a TFT with mobility as high as 80 $cm^2$/Vs has been achieved. The stabilities under positive and negative bias-temperature-stress are similar to that observed in TFTs with traditional ES structures (FIGS. 1a and 1b). A current stress test at Id~37 uA and 60° C. over 100 hr showed little change over the 100 hour test period. Such current operation stability validates these TFT for pixel drivers in OLED and LED displays. Such current operation stability also meets the demands for peripheral gate and data drivers. When the thickness of the BES was varied from 5 nm to 50 nm, similar TFT performance was observed. In other tests run, Ti—O was used for the BES layer, which was formed by means of AC or RF sputter, with the thickness varied from 5 nm to 40 nm, similar TFT performance was observed.

It should be understood that standard process flows used for IPS-AMLCD devices (either high aperture ratio design with a planarization layer or the design with bottom electrode in the same latitude as the channel layer) has additional insulator layers (either SiN for a-Si TFT or $SiO_2$, $Al_2O_3$ for MOTFT) over the top S/D contacts or the top gate contact. Via holes from top or bottom pixel electrode to D/D layer, or to metal gate layer can be processed with a single dry etch process: i.e, through interlayer, the planarization layer, the ES layer, and the gate insulator layer. Contact pads can thus accordingly be made in connection with each conductive layer. Storage capacitors can also be built between gate and S/D metals, or with pixel TCO electrodes between interlayers, or between top TCO and bottom gate metal. Thus, generally thin film electronic circuits can be constructed with the present MOTFT having blanket ES structure. In addition to constructing pixel drivers for LCD, OLED, and LED arrays, column and row drivers in peripheral areas outside the display matrix can also be made with the BES-type MOTFT disclosed in this invention. In addition to backpanels for displays, these thin film electronic circuits can also be used for readout circuits in image arrays, bio-sensor arrays, touch panels, for MEMS devices, and for integrated devices with multiple functions.

Thus, new and improved processes for fabricating stable, high mobility metal oxide thin film transistors (MOTFT) are disclosed. Generally, the new and improved processes include the use of blanket layers forming the etch-stop layer, which reduces the required number of process steps and can eliminate at least some of the critical tolerances in the process to reduce the minimum channel length that can be achieved.

Various changes and modifications to the embodiment herein chosen for purposes of illustration will readily occur to those skilled in the art. For example, thinning the BES layer in the D/S contact area (the overlaying area between S/D pads and channel layer) and even forming a through hole when needed. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:
1. A method of fabricating a high mobility semiconductor metal oxide thin film transistor comprising the steps of:
 depositing a layer of semiconductor metal oxide channel material;
 depositing a blanket layer of etch-stop material with opposed major surfaces on the layer of semiconductor metal oxide channel material, the blanket layer of etch-stop material defining a perpendicular direction orthogonal to the major surfaces and a horizontal direction orthogonal to the perpendicular direction and extending in the direction of the major surfaces, and the blanket layer of etch-stop material including one of the group consisting of a metal oxide, a metalloid oxide and an n-type organic material;

depositing a layer of source/drain metal on the blanket layer of etch-stop material;

patterning the layer of source/drain metal on the blanket layer of etch-stop material; and the patterning including etching the layer of source/drain metal into spaced apart source/drain terminals positioned to define a channel area in the semiconductor metal oxide layer, the etch-stop material allowing for electrons to tunnel between the source/drain terminals and the semiconductor metal oxide channel material, and providing electrical insulation between the spaced apart source/drain terminals, and the etch-stop material being chemically robust to protect the layer of semiconductor metal oxide channel material during the source/drain metal etching process.

2. The method as claimed in claim 1 wherein the step of depositing the layer of semiconductor metal oxide channel material includes depositing one of Indium-Oxide (In—O), Tin-Oxide (Sn—O), Zinc-Oxide (Zn—O), Galium-Oxide (Ga—O), In—Zn—O, In—Sn—O, In—Ga—O, Al—Zn—O, Ga—Zn—O, Ta—Zn—O, Ti—Zn—O, In—Ga—Zn—O, In—Ga—Sn—O, In—Al—Zn—O, In—Al—Sn—O, In—Ta—Zn—O, In—Ta—Sn—O, and their combinations in blend form or in multiple layer form.

3. The method as claimed in claim 1 wherein the step of depositing the layer of semiconductor metal oxide channel material includes depositing the semiconductor metal oxide channel layer in one of amorphous, crystalline, single-phase or multiple-phase form.

4. The method as claimed in claim 1 further including a step of annealing the layer of semiconductor metal oxide channel material in an oxygen ambient prior to the step of depositing the blanket layer of etch-stop material.

5. The method as claimed in claim 1 wherein the step of depositing the blanket layer of etch-stop material includes depositing a metal oxide including one of the group consisting of Ta—O, Ti—O, V—O, Hf—O, Zr—O, Pa—O, Cr—O, Ni—O, and their combinations in blend form or multiple layer form thereof.

6. The method as claimed in claim 5 wherein the step of depositing the blanket layer of metal oxide etch-stop material includes depositing a metal oxide etch-stop material with an energy gap in a range of 3 eV-4.5 eV.

7. The method as claimed in claim 5 wherein the step of depositing the layer of etch-stop material includes depositing the material in one of the group consisting of amorphous, nano-crystalline, and polycrystalline form.

8. The method as claimed in claim 1 wherein the step of depositing the blanket layer of etch-stop material includes depositing an n-type organic material including one of the group consisting of Alq, BAlq, and fullerenes including one of the group consisting of graphene type carbon molecules, buckyball, C60 and derivatives thereof.

9. The method as claimed in claim 1 wherein the step of depositing the blanket layer of etch-stop material includes depositing the material by one of sputtering, plasma-enhanced chemical vapor deposition, MOCVD, atomic layer deposition (ALD), or a coating method from an organo-metallic precursor solution with subsequent annealing.

10. The method as claimed in claim 1 wherein the step of depositing the blanket layer of etch-stop material includes depositing a layer of etch-stop material with a thickness in a range of 5 nm to 100 nm.

11. The method as claimed in claim 1 further including a step of annealing the blanket layer of etch-stop material in an oxygen ambient subsequent to the step of etching the layer of source/drain metal into the source terminal and the drain terminal.

12. The method as claimed in claim 11 wherein the step of annealing the blanket layer of etch-stop material in an oxygen ambient provides at least one of diffusing metal from the S/D contacts into the ES layer, diffusing oxygen from the ES layer into the S/D contacts and/or forming an n+ layer at the interface under the S/D contacts.

13. The method as claimed in claim 1 wherein the step patterning the layer of source/drain metal on the blanket layer of etch-stop material includes patterning the layer of source/drain metal on the blanket layer of etch-stop material overlying a non-planar area under each of the source/drain terminals.

14. The method of fabricating a high mobility semiconductor metal oxide thin film transistor as claimed in claim 1 wherein the step of depositing the blanket layer of etch-stop material includes depositing etch-stop material with sufficient insulating characteristics to complete shut-off the thin film transistor in $I_d$-$V_{gs}$ performance.

15. A high mobility MOTFT with a gate electrode, a semiconductor metal oxide active layer, and source/drain electrodes, the MOTFT comprising:

a blanket layer of etch-stop material positioned on and covering the semiconductor metal oxide active layer, the blanket layer including one of the group consisting of a metal oxide, a metalloid oxide and an n-type organic material in one of amorphous, crystalline, single-phase or multiple-phase form;

the source/drain electrodes positioned on the blanket layer of etch-stop material on a side opposite the semiconductor metal oxide active layer and further positioned to define a channel area in the semiconductor metal oxide layer; and the etch-stop material allowing for electrons to tunnel between the source/drain electrodes and the semiconductor metal oxide channel material, and providing electrical insulation between the spaced apart source/drain electrodes.

16. A high mobility MOTFT comprising:

a substrate;

a metal gate positioned on the substrate;

a layer of gate dielectric positioned over the metal gate and surrounding portions of the substrate;

an active channel layer of semiconductor metal oxide positioned over the layer of gate dielectric;

a blanket layer of etch-stop material with opposed major surfaces positioned over and covering the active channel layer, the blanket layer of etch-stop material defining a perpendicular direction orthogonal to the major surfaces and a horizontal direction orthogonal to the perpendicular direction and extending in the direction of the major surfaces, and the blanket layer of etch-stop material including one of the group consisting of a metal oxide, a metalloid oxide and an n-type organic material; and spaced apart metal source/drain terminals positioned on the blanket layer of etch-stop material with the blanket layer of etch-stop material interposed between the spaced apart metal source/drain terminals and the active channel area, the etch-stop material allowing for electrons to tunnel between the source/drain terminals and the semiconductor metal oxide channel material, and providing electrical insulation between the spaced apart source/drain terminals, and the spaced apart metal source/drain terminals being further positioned to define a channel area in the active channel layer.

17. The high mobility MOTFT of claim 16 wherein the active channel layer of semiconductor metal oxide material includes one of the group consisting of Indium-Oxide (In—O), Tin-Oxide (Sn—O), Zinc-Oxide (Zn—O), Gallium-Oxide (Ga—O), In—Zn—O, In—Sn—O, In—Ga—O, Al—Zn—O, Ga—Zn—O, Ta—Zn—O, Ti—Zn—O, In—Ga—Zn—O, In—Ga—Sn—O, In—Al—Zn—O, In—Al—Sn—O, In—Ta—Zn—O, In—Ta—Sn—O, and their combinations in blend form or in multiple layer form.

18. The high mobility MOTFT of claim 16 wherein the semiconductor metal oxide channel layer is in amorphous, crystalline, single-phase or multiple-phase forms.

19. The high mobility MOTFT of claim 16 wherein the blanket layer of etch-stop material includes a metal oxide including one of the group consisting of Ta—O, Ti—O, V—O, Hf—O, Zr—O, Pa—O, Cr—O, Ni—O, and combinations thereof.

20. The high mobility MOTFT of claim 19 wherein the layer of etch-stop material includes the metal oxide in one of the group consisting of amorphous, nano-crystalline, and polycrystalline form.

21. The high mobility MOTFT of claim 16 wherein the blanket metal oxide etch-stop material has an energy gap in a range of 3 eV-4.5 eV.

22. The high mobility MOTFT of claim 16 wherein the blanket layer of etch-stop material includes an n-type organic material including one of the group consisting of Alq, BAlq, and fullerenes including one of the group consisting of graphene type carbon molecules, buckyball, C60 and derivatives thereof.

23. The high mobility MOTFT of claim 16 wherein the blanket layer of etch-stop material has a thickness in a range of 5 nm to 100 nm.

24. The high mobility MOTFT of claim 16 wherein the blanket layer of etch-stop material includes etch-stop material with sufficient insulating characteristics to complete shut-off the high mobility MOTFT in $I_d$-$V_{gs}$ performance.

25. A thin film electronic backpanel circuit comprising a plurality of high mobility MOTFTs, each MOTFT including:
   a substrate;
   a metal gate positioned on the substrate;
   a layer of gate dielectric positioned over the metal gate and surrounding portions of the substrate;
   an active layer of semiconductor metal oxide positioned over the layer of gate dielectric;
   a blanket layer of etch-stop material positioned over and covering the active layer, the blanket layer of etch-stop material including one of the group consisting of a compound comprising one of a metal oxide, a metalloid oxide or an n-type organic material;
   spaced apart metal source/drain terminals positioned on the blanket layer of etch-stop material with the blanket layer of etch-stop material interposed between the spaced apart metal source/drain terminals and the active channel area, and further positioned to define a channel area in the active layer; and
   the etch-stop material allowing for electrons to tunnel between the source/drain terminals and the semiconductor metal oxide channel material, and providing electrical insulation between the spaced apart source/drain terminals.

* * * * *